Feb. 25, 1969 T. H. BLADEN 3,430,153
BALANCED AMPLIFIER BURST SIGNAL GATE
Filed Jan. 26, 1965
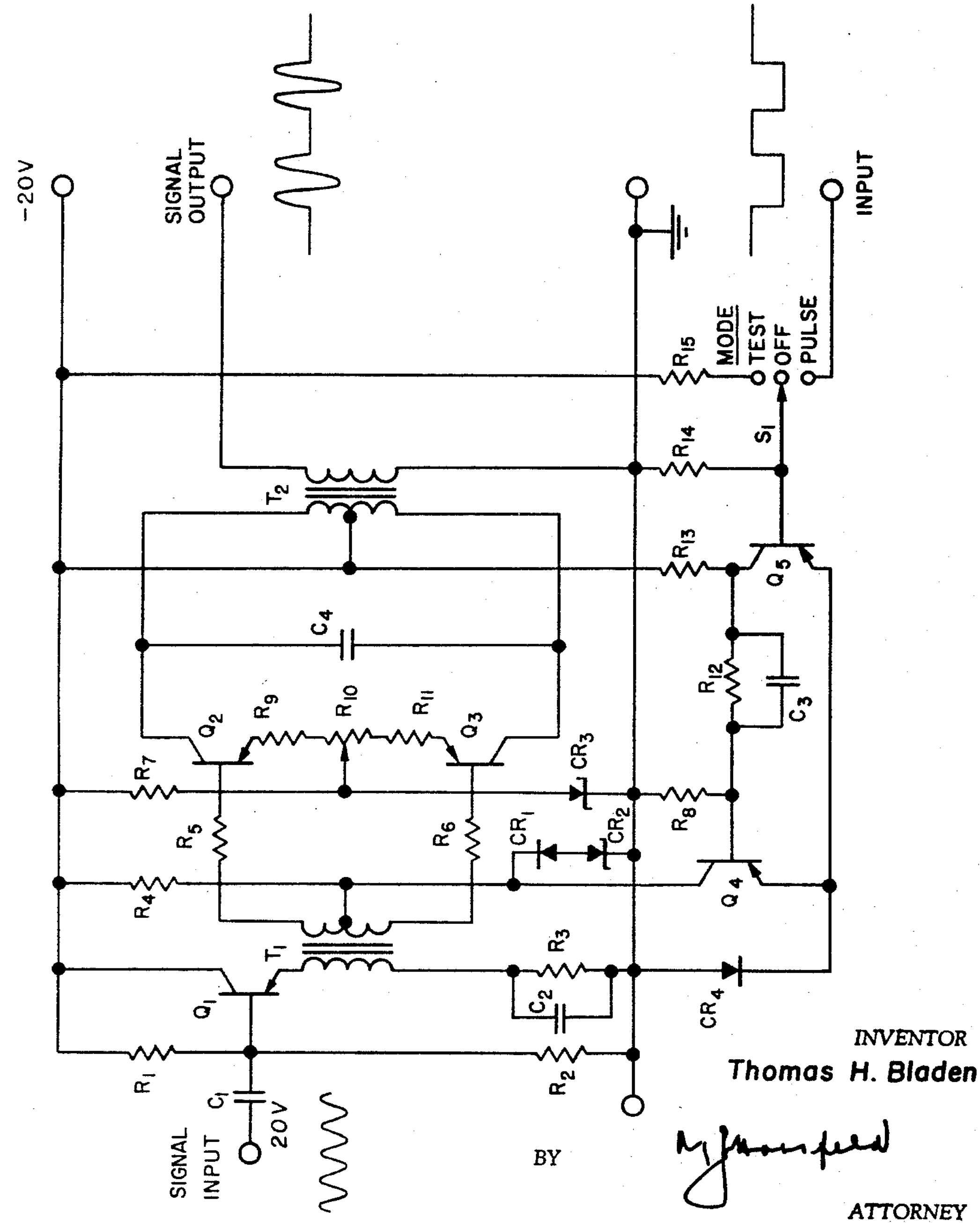
INVENTOR
Thomas H. Bladen
BY
ATTORNEY United States Patent Office 3,430,153

Patented Feb. 25, 1969

3,430,153
BALANCED AMPLIFIER BURST SIGNAL GATE

Thomas H. Bladen, Adelphi, Md., assignor to the United States of America as represented by the Secretary of the Navy Filed Jan. 26, 1965, Ser. No. 428,267
U.S. Cl. 330—15 8 Claims
Int. Cl. H03f 3/00, 3/26

ABSTRACT OF THE DISCLOSURE

A balanced amplifier burst signal gate which comprises a push-pull transistorized class B amplifier stage having a pair of interconnected transistors. A monostable gating circuit which includes a pair of transistors provides a bias for the transistors in the push-pull stage. By applying a gating signal to one of the transistors in the gating circuit, the conductive states of the cascaded transistors therein can be changed and, accordingly, the push-pull stage can be switched from cut off to class B operation.

The invention described herein may be manufactured and used by or for the Government of the United States of America for governmental purposes without the payment of any royalties thereon or therefor.

The present invention relates generally to gating circuitry and particularly to an improved transistorized balanced amplifier audio burst signal gate designed to provide a periodic audio frequency signal burst with a minimum of switching transients and distortion.

The balanced amplifier burst signal gate of the present invention is designed for use in a signal synthesizer employed in the performance testing of various types of receiving circuits. In addition, the present invention may be used as a coherent burst signal gate of the type commonly employed in testing multi-channel filter banks.

Prior art gating circuits which have been used with receiving circuitry and multi-channel filters have often caused false excitation of the tuned receiving circuits due to switching transients produced by the unbalanced gating circuitry with no audio signal applied to the gate input terminals. This is operationally undesirable in that accurate signal-to-noise measurements at high receiver sensitivity levels are prevented and the switching transients and distortion eventually appear in the output of the synthesizer and receiving circuitry.

A typical method of balanced gating for testing various types of receiving circuits was to use a single ended gate biased class A for applying audio signal bursts to the receiving circuitry. However, switching transients for class A operation rendered this method of gating undesirable.

The present invention was designed to eliminate the switching transients and distortion inherent in prior art audio signal gates. The invention to be described includes a class B push-pull amplifier having high input and low output impedances and adapted to be driven by a transistorized monostable gating circuit in the form of a modified Schmitt trigger in such a manner as to provide an output signal burst with a minimum of switching transients and low distortion.

An object of the invention is to provide a new and improved audio signal gate for the performance testing of various types of receiving and synthesizing circuits.

Another object of the invention is to provide a new and improved audio signal gate for producing an audio output signal burst having a minimum of switching transients and distortion.

Other objects of the invention will become more readily apparent from the following detailed description of an embodiment thereof presented in the accompanying drawing.

Briefly described the invention comprises a balanced push-pull transistorized class B amplifier stage including a pair of transistors interconnected by resistors at the emitter electrodes thereof and transformer coupled to input and output circuits at the base and collector electrodes respectively. A monostable gating circuit in the form of a modified Schmitt trigger having a pair of cascaded transistors therein is connected via a pair of biasing circuits to the base and collector electrodes, respectively, of the transistors in the push-pull stage. A biasing circuit connected between a point of reference potential and the emitter electrodes of the transistors in the push-pull stage biases the push-pull stage cutoff when the gating stage is in one conductive state and the aforesaid biasing circuit biases the push-pull stage for class B operation when the gating stage is in another conductive state. By applying a gating signal to one of the transistors in the gating stage, the conductive states of the cascaded transistors therein can be changed and, accordingly, the push-pull stage can be switched from cut off to class B operation instantly.

A more complete appreciation of the invention and many of the attendant advantages thereof will be readily appreciated as the same becomes better understood by reference to the following detailed description when considered in connection with the accompanying solitary view which illustrates a balanced amplifier burst signal gate according to the present invention.

Referring to the drawing, there is shown an emitter-follower input stage including transistor Q1 and having a voltage divider comprised of resistors R1 and R2 between the minus 20 volt power supply and ground for biasing Q1 class A. The input winding of transformer T1 is connected between the emitter electrode of Q1 and ground for providing the AC coupling and DC isolation between the emitter-follower stage and the push-pull amplifier stage. Further included in the emitter-follower stage is a current limiting resistor R3 connected between the input winding of transformer T1 and ground and a capacitor C2 for establishing an AC reference potential at the input winding of T1.

The balanced amplifier stage of the invention includes transistors Q2 and Q3 connected in push-pull fashion with their emitter electrodes resistance connected and their base and collector electrodes connected as shown to the input transformer T1 and output transformer T2, respectively. Resistors R4 and R7 are connected as shown between the —20 volt power supply and the push-pull stage and provide, in combination with the monostable gating circuitry to be described, the necessary biasing potential for class B operation when the monostable gating stage is in one of its conductive states.

Resistors R5 and R6 connected between the input transformer and the control electrodes of the transistors Q2 and Q3 serve to suppress high frequency transients, and capacitor C4 which is connected between the output electrodes of transistors Q2 and Q3 substantially eliminates the switching transients and other spurious high frequency components in the gate output.

The monostable gating stage which determines the conductive state of the push-pull amplifier includes a pair of cascaded transistors Q4 and Q5 with the collector of transistor Q5 being coupled via RC network R12, C3 to the control or base electrode of Q4. A first circuit means including breakdown diode CR3 is connected between the emitter electrodes of Q2 and Q3 and a point of reference potential. A second circuit means connects the collector of Q4 directly to the center tap of the output winding of T1, and the collector of Q5 is connected via a third circuit means including resistor R13 to the center tap of the input winding of the output transformer T2. The input transistor Q5 of the monostable gating stage is non-conducting in the absence of an input gating pulse at the control electrode thereof and diode CR4 provides the necessary emitter-base reverse bias to insure that Q5 remains cut off in the absence of a negative gating signal applied thereto. Transistor Q4 is normally conducting in the absence of a negative gating pulse applied to transistor Q5.

The following is a table of values and types for the various circuit components used in audio signal gate shown and described.

TABLE I

| Component: | Value |
|---|---|
| R1 | 39KΩ |
| R2 | 22KΩ |
| R3 | 4.7KΩ |
| R4 | 6.8KΩ |
| R5 | 150Ω |
| R6 | 150Ω |
| R7 | 2.7KΩ |
| R8 | 2.4KΩ |
| R9 | 16Ω |
| R10 | 100Ω |
| R11 | 16Ω |
| R12 | 2.4KΩ |
| R13 | 16KΩ |
| R14 | 56KΩ |
| R15 | 82KΩ |
| C1 ----μfd-- | 10 |
| C2 ----μfd-- | 33 |
| C3 ----pfd-- | 100 |
| C4 ----pfd-- | 330 |
| Zin (T1) | 10KΩ |
| Zout (T1) | 1.5KΩ |
| Zin (T2) | 10KΩ |
| Zout (T2) | 200Ω |
| Q1 | 2N1307 |
| Q2, Q3 | 2N329 |
| Q4, Q5 | 2N404 |
| CR1 | 1N457 |
| CR2, CR3 | 1N775B |
| CR4 | 1N276 |

*Operation*

The breakdown diode CR3 holds the midpoint of resistor R10 at approximately −7.5 volts and biases the push-pull stage cutoff with no gating pulse applied to the base electrode of Q5. When a negative gating pulse is applied to the base electrode of Q5, Q5 conducts and a positive going signal is applied via resistor R12 and capacitor C3 to the base electrode of Q4 to reverse bias the emitter base junction of Q4 and drive Q4 to cutoff. At this point the collector voltage of Q4 goes negative toward the −20 volt power supply voltage but the diode CR2 in series with silicon diode CR1 breaks down at about −7.5 volts and establishes a voltage of approximately −8 volts at the base electrodes of the push-pull transistors Q2 and Q3. This voltage of −8 volts is slightly more negative than the −7.5 volts applied to the emitter electrodes of Q2 and Q3 and thus forward biases the transistors Q2 and Q3 in the push-pull amplifier stage. This slight forward bias sets the push-pull stage for class B operation. Resistor R10 may be adjusted so that the quiescent collector currents of Q2 and Q3 are approximately 1 milliamp in order to eliminate signal crossover distortion and to limit excessive signal currents.

Partial temperature compensation is accomplished through the $I_{CB0}$ effective cancellation between diodes CR1, CR2 and CR3 and also between the emitter-base junctions of Q2 and Q3. Transistors Q2 and Q3 are PNP diffused silicon alloy units having adequate $B_{VCD0}$ and $B_{VED0}$ ratings for use in a gate of this type.

With transistor Q4 forward biased and conducting in the absence of a gating pulse at Q5, the collector voltage of Q4 is approximately −0.5 volt which is equal to $V_{CE}$ (saturation) plus the voltage drop across the diode CR4. This voltage is applied through transformer T1 to the bases of Q2 and Q3 in the push-pull stage. The emitter-base junctions of Q2 and Q3, however, remain reverse biased due to the −7.5 volts applied between the midpoint of R10 and ground and neither Q2 nor Q3 will conduct for input signals below about 7 volts peak. This assures that no normal audio signal peaks will pass through the push-pull stage to the output transformer in the absence of a gating signal at Q5. When, however, a negative gating pulse is applied at the base of Q5, the collector voltage of Q5 is lowered to $V_{CE}$ (saturation) plus the voltage drop across diode CR4. The voltage divider effect of resistors R8 and R12 reverse biases the base-emitter junction of Q4 and turns Q4 off. The 100 μfd. capacitor C3 overcomes the RC time constant effect of resistor R12 and the base-emitter-collector capacity of transistor Q4 thereby increasing the operation speed of the monostable gating circuit. As mentioned above, the collector voltage of Q4 is regulated by the diodes CR1 and CR2 to establish a slight forward bias at Q2 and Q3.

Substantially all of the DC bias level switching transients are eliminated at the gate output due to the differential mode connection between Q2 and Q3 and the transformer T2 thus providing a cancellation of the bias transients when Q2 and Q3 conduct simultaneously. These DC bias switching transients are further reduced due to the small quiescent forward bias applied to the class B operated push-pull stage.

Potentiometer R10 provides a vernier adjustment to compensate for a slight difference in gain and unbalance that might exist between Q2 and Q3.

The switch S1 at the input of the bistable gating stage provides a means for selecting normal pulsed gate operation or continuous on or off gate operation.

The signal frequency response and the high frequency signal burst repetition rates for the amplifier signal gate of the present invention are limited primarily by the frequency response characteristics of the coupling transformers T1 and T2.

Obviously many modifications can be made in the above-described embodiment of the invention without departing from the spirit and scope thereof. Therefore it should be understood that the invention is limited only by the appended claims.

I claim:

1. An amplifier gating circuit comprising:

(a) a balanced push-pull amplifier stage including a pair of transistors, the emitter electrodes of which are interconnected via resistance means, and the base and collector electrodes of which are coupled through an input and an output transformer, respectively, to input and output circuit means;

(b) a monostable gating circuit comprising first and second transistors connected in cascade;

(c) a first circuit means connected between a power supply and a point of reference potential, and connected through said resistance means to the emitter electrodes of said pair of transistors in said push-pull amplifier stage for establishing a bias potential between the emitter electrodes and said point of reference potential;

(d) second circuit means connected between said power supply and said second transistor in said monostable gating circuit, and connected through said input transformer to the base electrodes of said pair of transistors in said balanced push-pull amplifier stage for establishing a reverse bias at each of said transistors in said push-pull stage when said monostable gating circuit is in a first conductive state; and (e) third circuit means connected between said power supply and the output electrode of said first transistor in said monostable gating circuit, and connected through said output transformer to the collector electrodes of said pair of transistors in said push-pull amplifier stage, whereby when said first and second transistors in said monostable gating circuit interchange their conductive states, said transistors in said push-pull stage become slightly forward biased for class B operation.

2. The circuit of claim 1 wherein:

(a) said first circuit means includes a breakdown diode connected to the resistance means between the emitter electrodes of said transistors in said push-pull stage for maintaining a constant biasing potential on said emitter electrodes, and (b) a diode connected between the emitter and base electrodes of said first transistor in said monostable gating stage for biasing said first transistor to cutoff in the absence of a gating signal applied to said monostable gating stage.

3. The circuit of claim 1 wherein:

(a) said input circuit includes an emitter-follower transistor stage connected to receive audio signals at the input thereof, (b) an input winding of said input transformer being connected to the emitter electrode of said emitter-follower and (c) a parallel RC circuit connected between said input winding and a point of reference potential for establishing an A.C. reference potential at said input winding, and (d) a fourth circuit means connected to said emitter-follower stage and to said power supply for biasing said emitter-follower for class A operation.

4. The circuit of claim 1 wherein:

(a) the output of said second transistor in said monostable gating stage is connected to the center tap of the output winding of the input transformer, (b) a breakdown diode connected to a point of reference potential and (c) a regular diode poled oppositely to said breakdown diode and connected between said breakdown diode and the output electrode of said second transistor in said gating stage whereby a combination of said last-named diodes provides a slight forward bias between the emitter and base electrodes of the transistors in said push-pull stage when said second transistor of said monostable gating stage is cutoff.

5. The circuit of claim 1 wherein:

(a) a resistor is connected between the base electrodes of each transistor in said push-pull stage and the output winding of said input transformer for suppressing high frequency transients applied to the push-pull stage and (b) a capacitor is connected between the output electrodes of said transistors in said push-pull stage for reducing switching transients and other spurious high frequency components in the output signal of the push-pull amplifier stage.

6. The circuit of claim 2 wherein:

(a) said input circuit includes an emitter-follower transistor stage connected to receive audio signals at the input thereof, (b) an input winding of said input transformer being connected to the emitter electrode of said emitter-follower stage and (c) a parallel RC circuit connected between said input winding and a point of reference potential for establishing an A.C. reference potential at said input winding.

7. The circuit of claim 6 wherein:

(a) the output electrode of said second transistor in said monostable gating stage is connected to the center tap of the output winding of the input transformer, (b) a breakdown diode and a regular semiconductor diode oppositely poled and serially connected between the center tap of the output winding of said input transformer and a point of reference potential for establishing a slight forward bias between the emitter and the base electrodes of each of said pair of transistors in said push-pull stage for eliminating crossover distortion when said push-pull stage is driven class B by audio signals.

8. The circuit of claim 7 which further includes (a) a resistor connected between the base electrode of each transistor in said pair of transistors in said push-pull stage and opposite ends respectively of the output winding of the input transformer and, (b) a capacitor connected between the output electrodes of said pair of transistors in said push-pull stage and in parallel with the input winding of the output transformer for reducing switching transients and eliminating spurious high frequency components in the output signal.

References Cited

UNITED STATES PATENTS

| | | | |
|---|---|---|---|
| 2,324,314 | 7/1943 | Michel | 328—195 X |
| 2,795,695 | 6/1957 | Raynsford | 328—195 X |
| 3,210,668 | 10/1965 | Stull | 328—101 |

JOHN KOMINSKI, *Primary Examiner.*

SIEGFRIED H. GRIMM, *Assistant Examiner.*

U.S. Cl. X.R.

307—242; 325—170; 328—101; 330—51